(12) United States Patent
Chen

(10) Patent No.: US 8,450,746 B2
(45) Date of Patent: May 28, 2013

(54) PIXEL ARRAY SUBSTRATE AND DETECTING MODULE

(75) Inventor: Yu-Heing Chen, Chu-Nan (TW)

(73) Assignees: Innocom Technology ( Shenzhen) Co. Ltd., Shenzhen (CN); Chimei Innolux Corporation, Chu-Nan (TW)

( * ) Notice: Subject to any disclaimer, the term of this patent is extended or adjusted under 35 U.S.C. 154(b) by 0 days.

(21) Appl. No.: 13/541,630

(22) Filed: Jul. 3, 2012

(65) Prior Publication Data

US 2013/0037794 A1 Feb. 14, 2013

(30) Foreign Application Priority Data

Aug. 9, 2011 (TW) .............................. 100128420 A

(51) Int. Cl.
*H01L 27/14* (2006.01)
*H01L 29/04* (2006.01)
*H01L 29/15* (2006.01)
*H01L 31/036* (2006.01)

(52) U.S. Cl.
USPC ........................ 257/72; 257/59; 257/E21.656

(58) Field of Classification Search ........... 257/E21.645, 257/E21.656, E21.646, E33.076, E25.032, 257/257/43, 59, 72, 225, 257, 258, 290, 291, 257/292, 293, 21, 79, 80, 83, 84, 184, 431, 257/443, 444

See application file for complete search history.

(56) References Cited

U.S. PATENT DOCUMENTS

| 7,420,634 | B2 * | 9/2008 | Lee ................................ 349/114 |
| 2009/0267121 | A1 * | 10/2009 | Ishida et al. ................... 257/292 |
| 2011/0147751 | A1 * | 6/2011 | Sunohara ........................ 257/59 |

* cited by examiner

*Primary Examiner* — Thanh Y Tran
(74) *Attorney, Agent, or Firm* — Liu & Liu

(57) ABSTRACT

A pixel array substrate including a substrate and a plurality of pixel structures is provided. Each pixel structure includes a patterned metal layer, an insulating layer, a patterned semiconductor layer and a data line layer. The patterned metal layer includes a gate line and a common electrode line. The patterned semiconductor layer includes a channel layer and a photosensitive resistance layer. The channel layer is disposed above and overlaps a part of the gate line. The data line layer includes a patterned first data line, a second data line and a third data line. The first and the second data lines are coupled to the channel layer and combine with the channel layer and the gate line to compose an active component. The second and the third data lines are coupled to the photosensitive resistance layer and combine with the photosensitive resistance layer to compose a light detecting component.

13 Claims, 8 Drawing Sheets

PIXEL ARRAY SUBSTRATE AND DETECTING MODULE

This application claims the benefit of Taiwan application Serial No. 100128420, filed Aug. 9, 2011, the subject matter of which is incorporated herein by reference.

BACKGROUND OF THE INVENTION

1. Field of the Invention

The invention relates in general to a detecting module, and more particularly to a pixel array substrate and a detecting module used for detecting a light signal.

2. Description of the Related Art

Conventional X-ray detection technique which requires the developing of a negative film has gradually been replaced with digitalized X-ray detector. The X-ray detector is composed of a plurality of photodiode arrays formed mainly by amorphous silicon. When the light source of the X-ray detector emits an X-ray of a specific wavelength, the X-ray, first of all, is converted into a visible light by a scintillator. Next, after receiving the visible light, the photodiode arrays generate an electron-hole pair which is collected by the electrode to generate an electrical signal.

In general, the amorphous silicon photodiode arrays form a vertical multi-layer stacking structure, which mainly includes a lower electrode layer, an N-type semiconductor layer, an intrinsic amorphous silicon layer, a P-type semiconductor layer, a transparent conductive layer and an upper electrode layer. The N-type semiconductor layer and P-type semiconductor layer are for increasing the energy barrier of the intrinsic amorphous silicon layer to avoid the leakage current generating an erroneous signal. The N-type semiconductor layer and the P-type semiconductor layer also make the I-V curve of the detector become a diode characteristic curve. Since each film layer requires a lithography process and the thin-film transistor originally has six processes, conventional X-ray detector totally requires more than 11 processes which are too complicated for large scale production. In addition, the larger the required number of layers, the more difficult the manufacturing of film layers, and the lower the yield rate. Since conventionally the photodiode array and the thin-film transistor are manufactured separately and the patterned area of the pixel is limitary, the aperture rate at most is about 70%.

SUMMARY OF THE INVENTION

The invention is directed to a pixel array substrate and a detecting module. Unlike the conventional vertical multi-layer stacking structure, the difficulties encountered in manufacturing the pixel array substrate and the detecting module of the invention are largely reduced, and the associated manufacturing processes are simplified.

According to an embodiment of the present invention, a pixel array substrate including a substrate and a plurality of pixel structures is provided. The pixel structures are disposed on the substrate. Each pixel structure includes a patterned metal layer, an insulating layer, and a patterned semiconductor layer. The patterned metal layer includes a gate line and a common electrode line. The insulating layer covers the gate line and the common electrode line. The patterned semiconductor layer is located on the insulating layer and includes a channel layer and a photosensitive resistance layer. The channel layer is located above the gate line and overlaps the gate line. The data line layer is located on the insulating layer. The data line layer includes a patterned first data line, a second data line and a third data line. The first and the second data lines are coupled to the channel layer respectively and combine with the channel layer and the gate line to compose an active component. The second data line and the third data line are coupled to the photosensitive resistance layer respectively and combine with the photosensitive resistance layer to compose a light detecting component.

According to another embodiment of the present invention, a pixel array substrate including a substrate and a plurality of pixel structures is provided. The pixel structures are disposed on the substrate. Each pixel structure includes a patterned first metal layer, an insulating layer, a channel layer, a data line layer, a first protection layer, a patterned second metal layer and a photosensitive resistance layer. The patterned first metal layer includes a gate line and a common electrode line. The insulating layer covers the gate line and the common electrode line. The channel layer is located on the insulating layer. The channel layer is located above the gate line and overlaps the gate line. The data line layer is located on the insulating layer. The data line layer includes a patterned first data line and a second data line. The first and the second data lines are coupled to the channel layer respectively and combine with the channel layer and the gate line to compose an active component. The first protection layer covers the first data line and a part of the second data line. The patterned second metal layer includes a contact electrode and a third data line. The contact electrode is located on the second data line. The third data line is located on the first protection layer. The photosensitive resistance layer is disposed on the first protection layer and covers the contact electrode and the third data line. The photosensitive resistance layer combines with the contact electrode, the second data line and the third data line to compose a light detecting component.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the following embodiments of the pixel structure, the pixel array substrate and the detecting module, the photosensitive resistance layer whose electrical field is in a horizontal direction replaces the conventional multi-layer stacking structure of the photodiode whose electrical field is in a vertical direction. In comparison to the conventional amorphous silicon layer, the photosensitive resistance layer has superior electron mobility, lower dark state current, and superior stability, and is easier to manufacture, hence largely reducing cost and increasing process yield rate. The photosensitive resistance layer may be formed by indium gallium zinc oxide (IGZO), which is a transparent semiconductor whose energy gap is about 3 eV. The photosensitive resistance layer may be used in conjunction with a scintillator (such as sodium iodide NaI or cesium Iodide doped with sodium CSI (Na)) conformed to the absorption wavelength (400 nm blue light) of IGZO. The I-V curve of the photosensitive resistance layer is a resistance characteristic straight line. In an embodiment, the photosensitive resistance layer and the channel layer of the thin-film transistor may be manufactured in the same process. The channel layer may also be formed by IGZO, and requires only six lithography processes. In another embodiment, if the patterned second metal layer, the photosensitive resistance layer, the second protection layer and the transparent conductive layer are subsequently manufactured after the thin-film transistor (the first five of the original six lithography processes) is completed, there are nine processes in total, and the light-receiving region of the photosensitive resistance layer is not subjected to the patterned area of the pixel, and a 100% aperture rate may thus be achieved.

A number of embodiments are disclosed below for elaborating the invention. However, the following embodiments of the invention are for detailed descriptions only, not for limiting the scope of protection of the invention.

First Embodiment

Figure 1A:
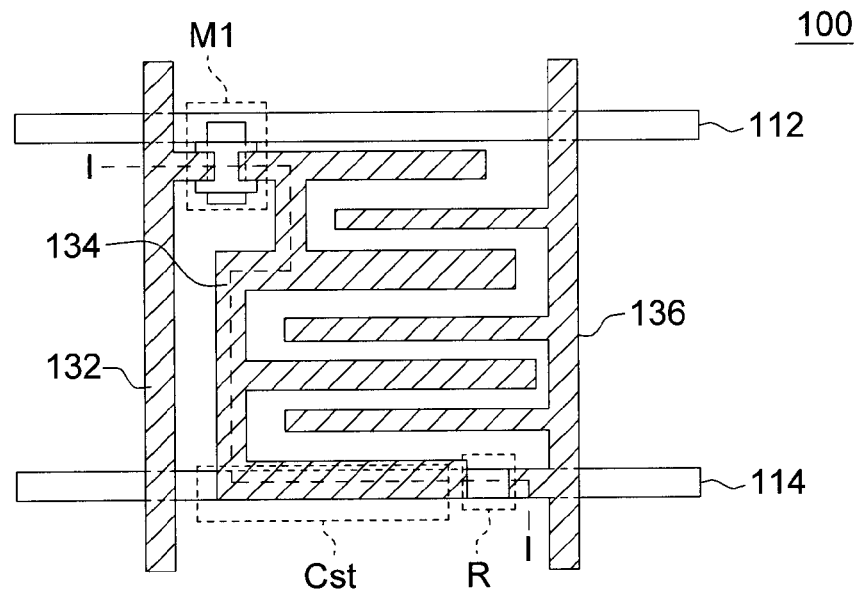
FIGS. 1A and 1B respectively are a top view of a pixel structure and a cross-sectional view of the pixel structure viewed along a cross-sectional line I-I according to a first embodiment of the invention.
Figure 1B:
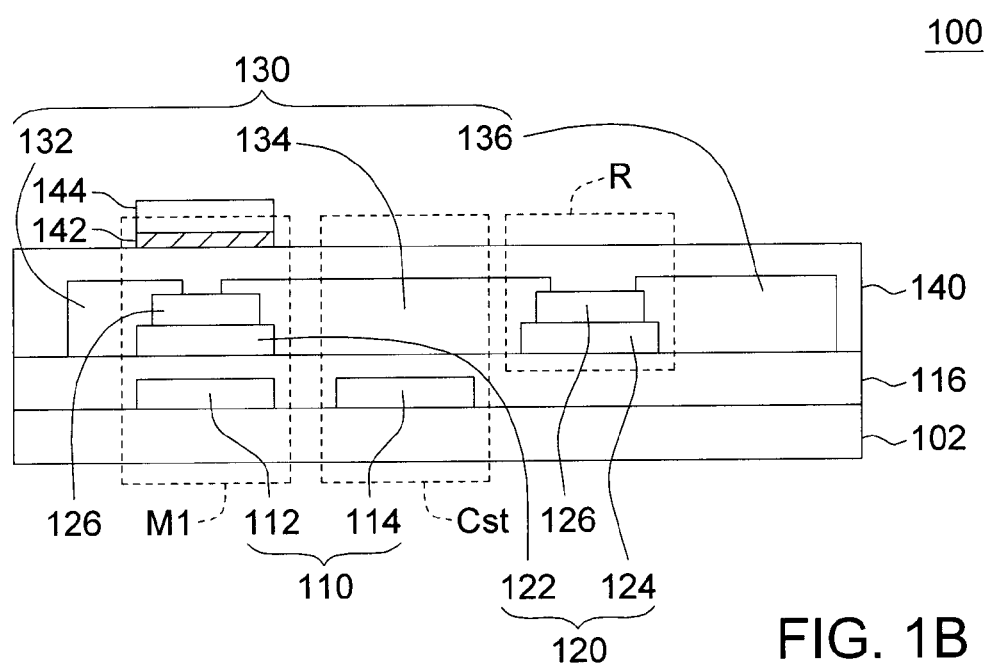
Figure 2:
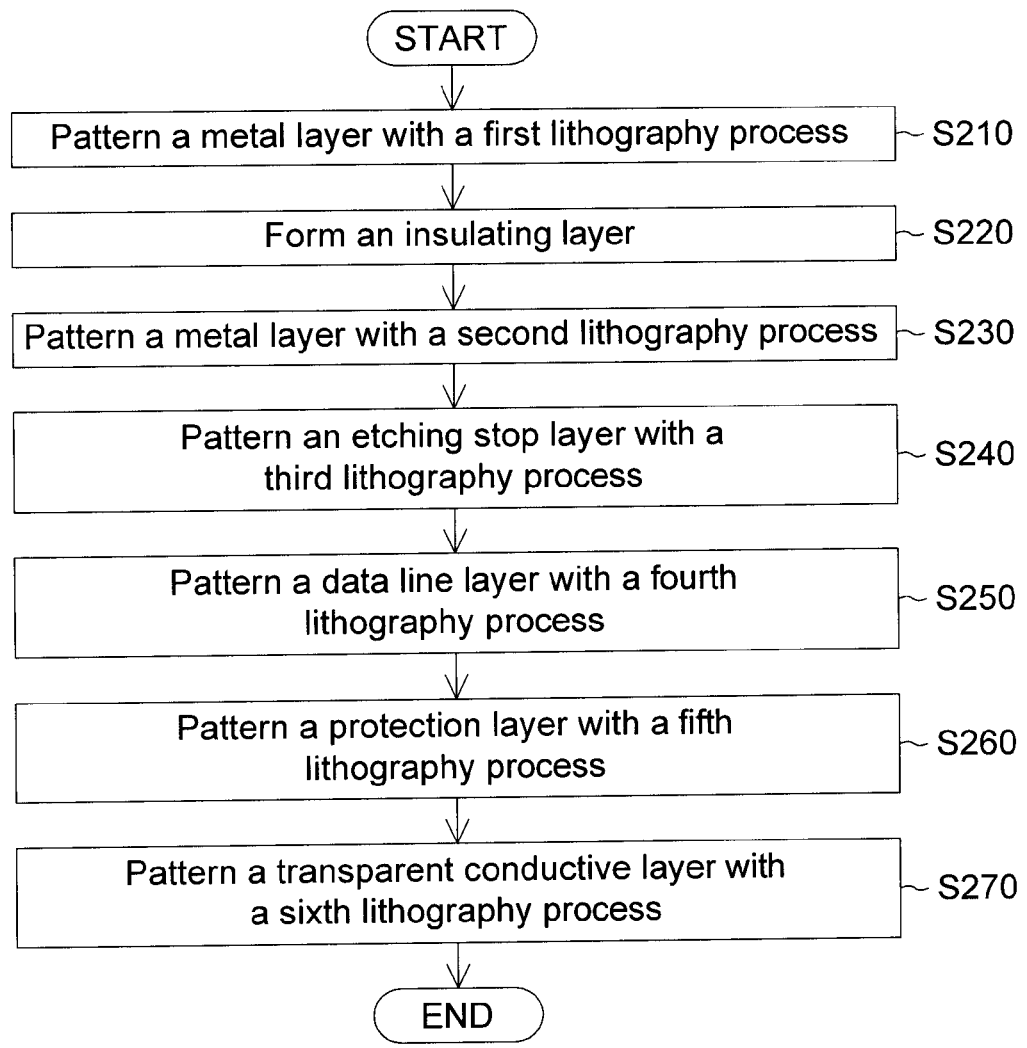
FIG. 2 shows a flow diagram of the manufacturing of a pixel structure according to a first embodiment of the invention.
Figure 3A:
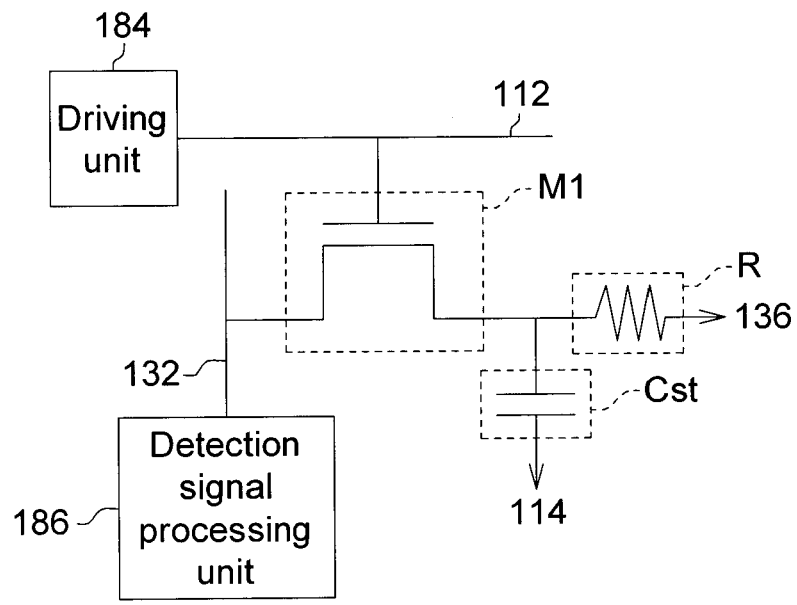
FIG. 3A shows an equivalent circuit diagram of the pixel structure of FIGS. 1A and 1B.
Figure 3B:
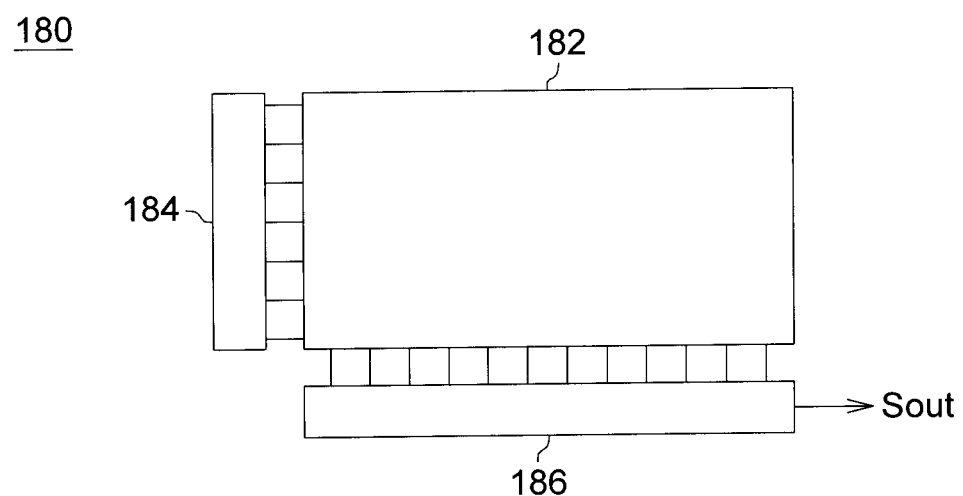
FIG. 3B shows a detecting module and its pixel array substrate.

FIGS. 1A and 1B respectively are a top view of a pixel structure and a cross-sectional view of the pixel structure along a cross-sectional line I-I according to a first embodiment of the invention. FIG. 2 shows a flow diagram of the manufacturing of a pixel structure according to a first embodiment of the invention. FIG. 3A shows an equivalent circuit diagram of the pixel structure of FIGS. 1A and 1B. FIG. 3B shows a detecting module and its pixel array substrate.

Referring to FIG. 1A. The pixel structure 100, formed from one side of the substrate 102 in an upward sequence, includes a patterned metal layer 110, an insulating layer 116, a patterned semiconductor layer 120, an etching stop layer 126 and a data line layer 130. In addition, the pixel structure 100 may further include a protection layer 140, a mask layer 142 and a transparent conductive layer 144. As indicated in FIGS. 1A and 1B, the region M1 denotes an active component (such as a thin-film transistor) including a gate line 112, an insulating layer 116, a channel layer 122, an etching stop layer 126, a first data line 132 and a second data line 134. The first and the second data lines 132 and 134 are electrically connected to the channel layer 122 respectively. The first data line 132 may be used as the driving line for the source of the thin-film transistor. The second data line 134 may be used as the signal line for the drain of the thin-film transistor. In addition, the region Cst denotes a storage capacitor, and the second data line 134 and the common electrode line 114 overlap with each other within the region Cst for storing electrical charges. Besides, the region R denotes a light detecting component including a photosensitive resistance layer 124, an etching stop layer 126, a second data line 134 and a third data line 136. The second data line 134 and the third data line 136 are electrically connected to the photosensitive resistance layer 124 respectively.

As indicated in FIG. 3A, before the photosensitive resistance layer 124 is radiated by a light, the photosensitive resistance layer 124, having a very large resistance and very low dark state current, is regarded as being shut down. Meanwhile, the gate of the active component M1 remains shutdown, so the electrical charges stored in the storage capacitor remain stable. When the photosensitive resistance layer 124 is radiated by the light, the resistance of the photosensitive resistance layer 124 will decrease as the intensity of the light increases. The third data line 136 is connected to an external bias voltage to form a channel between the second data line 134 and the third data line 136. Meanwhile, the electrical charges, controlled by the electrical field in a horizontal direction, flow towards the third data line 136 and make the voltage of the storage capacitor Cst approaching the bias voltage. Lastly, the gate of the active component M1 is opened, the illumination volume is obtained by using the first data line 132 to read the electrical charges stored in the storage capacitor Cst by each pixel structure 100.

As indicated in FIG. 3B, the detecting module 180 includes a pixel array substrate 182, a driving unit 184 and a detection signal processing unit 186. The pixel array substrate 182 includes a plurality of pixel structures 100 disposed on the substrate 102 as indicated in FIG. 1A. The driving unit 184 connects each gate line 112 for activating or shutting down the active component Ml. The detection signal processing unit 186 connects each first data line 132 to obtain the volume of electrical charges stored by each pixel structure 100 and output a detection signal Sout.

Figure 5:
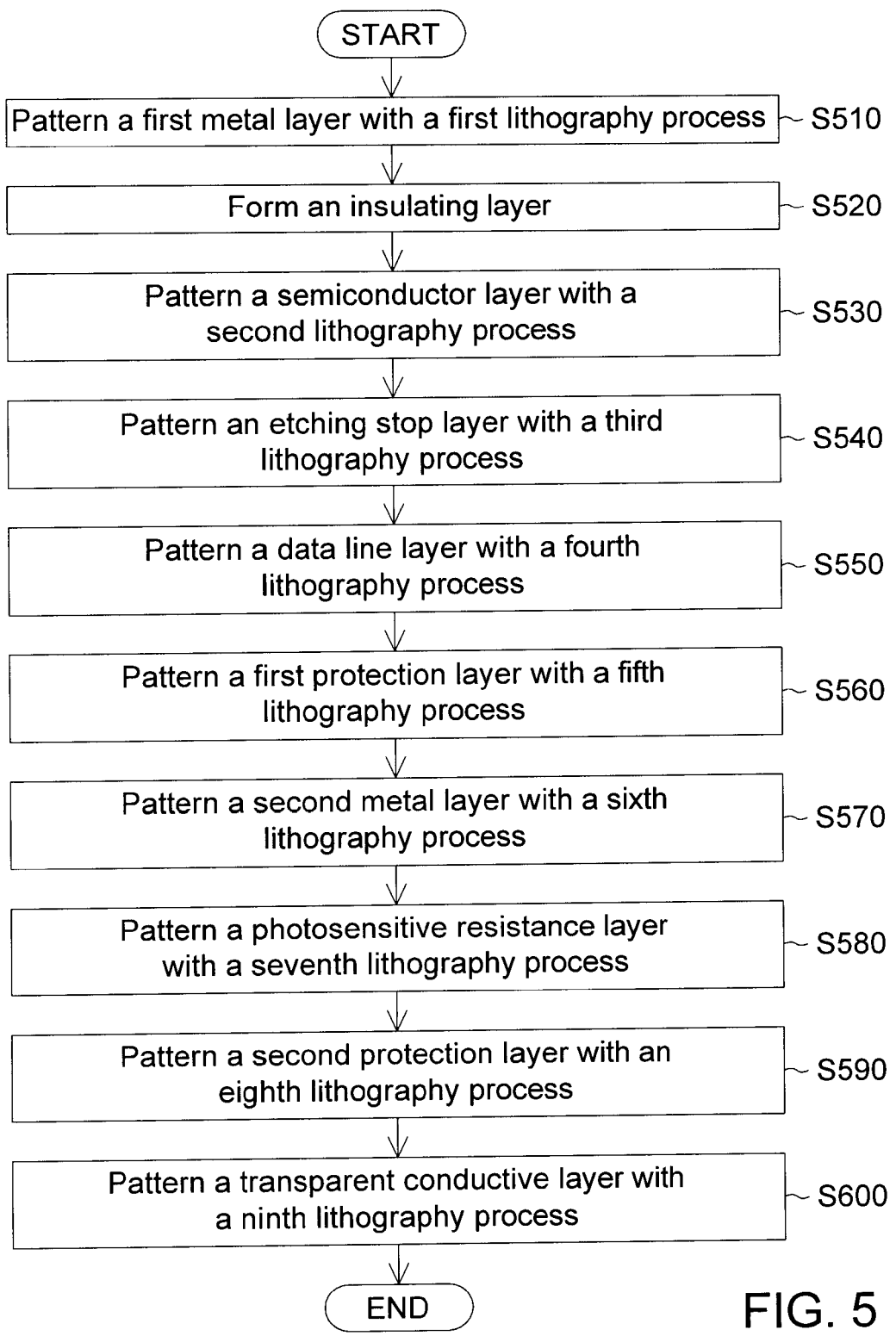
FIG. 5 shows a flow diagram of the manufacturing of a pixel structure according to a second embodiment of the invention.

Unlike the electrical field of conventional vertical stacking structure mainly formed by amorphous silicon which is in a vertical direction, the electrical field of the photosensitive resistance layer 124 of the present embodiment is in a horizontal direction. Unlike the conventional vertical stacking structure which requires 11 or more than 11 manufacturing processes, the photosensitive resistance layer 124 of the present embodiment employs fewer processes, so that the difficulties encountered in the manufacturing process are reduced and the procedures are simplified. The manufacturing method of the pixel structure of FIG. 5 is elaborated with the example of the pixel structure 100 of FIG. 1B.

Referring to FIG. 1B and FIG. 2. The process begins at step S210, a deposition process is performed to form a metal layer 110 on a substrate 102, and a first lithography process (lithography and etching processes) is performed to pattern the metal layer 110 to form a gate line 112 and a common electrode line 114. In step S220, an insulating layer 116 is formed on the gate line 112 and the common electrode line 114. The insulating layer 116 may be realized by a silicon oxide layer, a silicon nitride layer or a silicon oxynitride layer. The insulating layer 116 may be used as a gate insulating layer 116 of the active component M1. In step S230, a deposition process is performed to form a semiconductor layer 120 on the insulating layer 116, and a second lithography process is performed to pattern the semiconductor layer 120 to form a channel layer 122 and a photosensitive resistance layer 124. The channel layer 122 is disposed above the gate line 112 and overlaps a part of the gate line 112. In step S240, a third lithography process is performed to form an etching stop layer 126 on the channel layer 122 and the photosensitive resistance layer 124 respectively. The etching stop layer 126 avoids defects occurring to the contact surface between the active layer and the source/drain and affecting the ON/OFF switching of the active component M1. The invention does not need to be implemented by the etching stop layer 126 and may be selectively formed on the channel layer 122 and the photosensitive resistance layer 124 according to actual needs.

The channel layer 122 may be formed by an amorphous silicon layer or a poly-silicon layer. The photosensitive resistance layer 124 may be formed by IGZO. If both the channel layer 122 and the photosensitive resistance layer 124 are formed by indium gallium zinc oxide (IGZO), the channel layer 122 and the photosensitive resistance layer 124 may be manufactured in the same process to save costs and procedures for the manufacturing process.

In step S250, a deposition process is performed to form a data line layer 130 on the insulating layer 116, and a fourth lithography process is performed to pattern the data line layer 130 to form a first data line 132, a second data line 134 and a third data line 136. As indicated in FIG. 1B, the first data line 132 and the second data line 134 are coupled to the channel layer 122 respectively and combine with the channel layer 122 and the gate line 112 to compose an active component M1. In addition, the second data line 134 and the third data line 136 are coupled to the photosensitive resistance layer 124 respectively and combine with the photosensitive resistance layer 124 to compose a light detecting component R.

In step S260, a protection layer 140 is formed on the first data line 132, the second data line 134 and the third data line 136, and a fifth lithography process is performed to pattern the protection layer 140 to expose each pad (not illustrated in the diagram) at the signal end. In step S270, a deposition process is performed to form a transparent conductive layer 144 on the protection layer 140, and a sixth lithography process is performed to pattern the transparent conductive layer 144 to form the transparent conductive line and electrically connect each pad at the signal end.

The manufacturing method disclosed in the present embodiment avoids the occurrence of leakage current by further forming a mask layer 142 on the protection layer 140 lest the active component M1 might be radiated by a light. The mask layer 142 is located above the active component M1 and overlaps the active component M1. The mask layer 142 may be directly formed on the protection layer 140, on the transparent conductive layer 144 or between the protection layer 140 and the transparent conductive layer 144. The area of the mask layer 142 is not associated with the transparent conductive layer 144. The mask layer 142 may be formed by a metal or an opaque reflective material to block the external light.

Second Embodiment

Figure 4A:
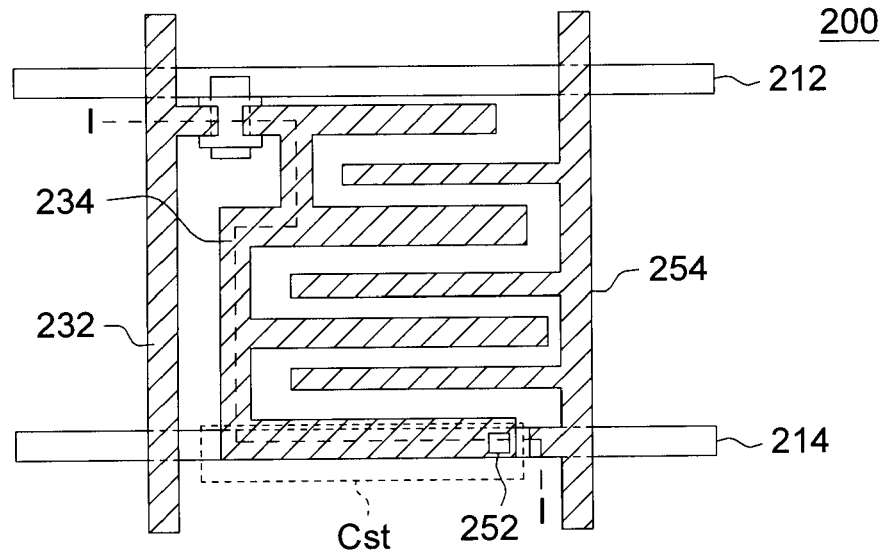
FIGS. 4A and 4B respectively are a top view of a pixel structure and a cross-sectional view of the pixel structure viewed along a cross-sectional line I-I according to a second embodiment of the invention.
Figure 4B:
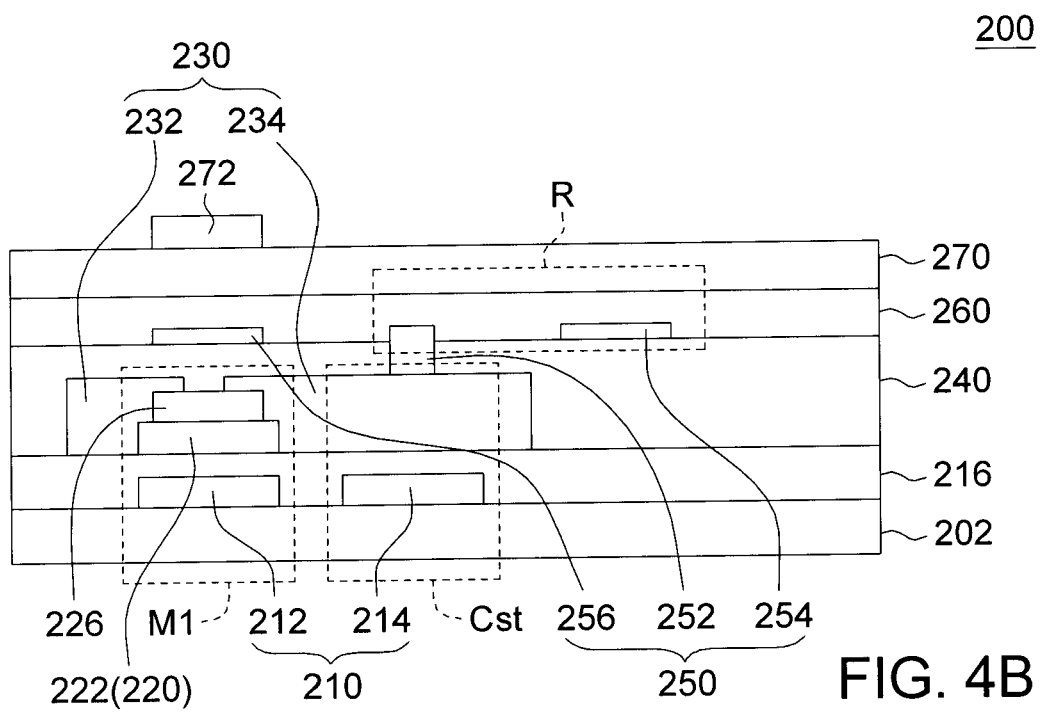
Figure 6A:
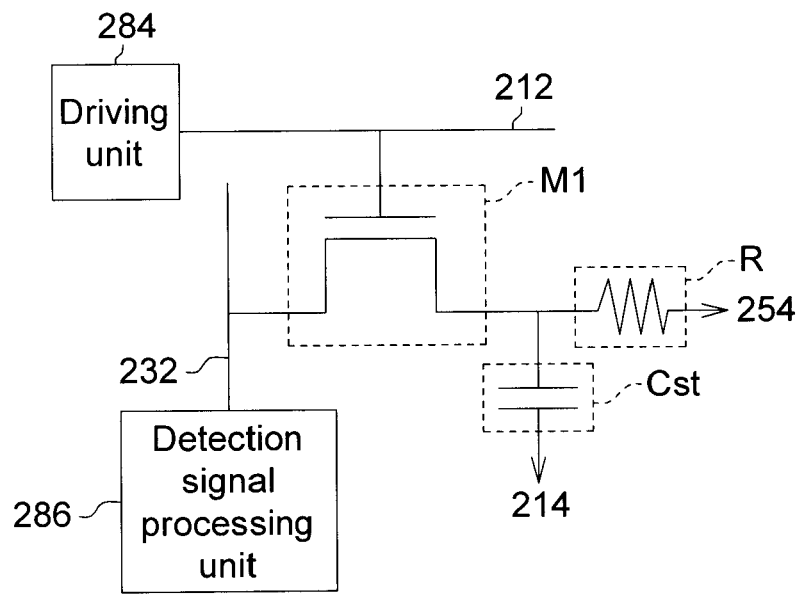
FIG. 6A shows an equivalent circuit diagram of. shows an equivalent circuit diagram of the pixel structure of FIGS. 4A and 4B.
Figure 6B:
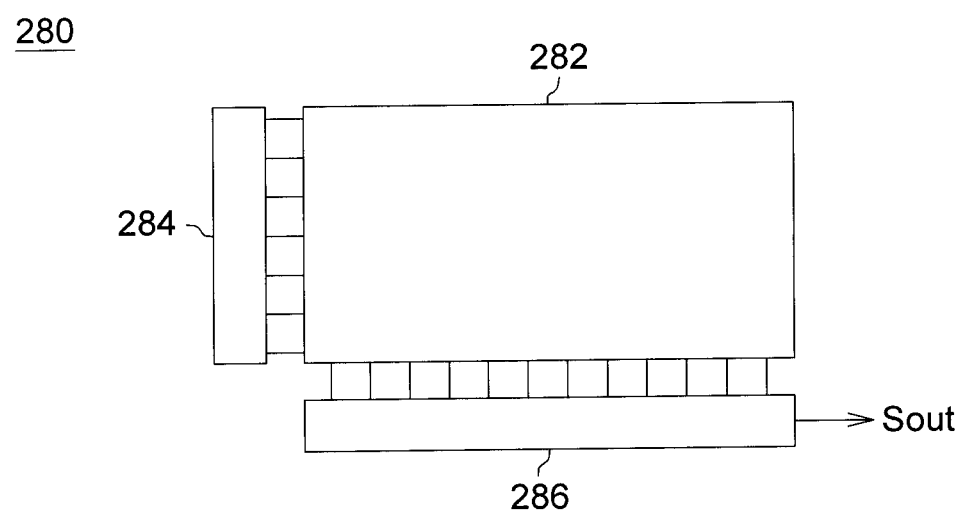
FIG. 6B shows a detecting module and its pixel array substrate.

FIGS. 4A and 4B respectively are a top view of a pixel structure and a cross-sectional view of the pixel structure viewed along a cross-sectional line I-I according to a second embodiment. FIG. 6A shows an equivalent circuit diagram of the pixel structure of FIGS. 4A and 4B. FIG. 6B shows a detecting module and its pixel array substrate.

Referring to FIG. 4A. The pixel structure 200, formed from one side of the substrate 202 in an upward sequence, includes a patterned first metal layer 210, an insulating layer 216, a channel layer 222, an etching stop layer 226, a data line layer 230, a first protection layer 240, a patterned second metal layer 250 and a photosensitive resistance layer 260. In addition, the pixel structure 200 may further include a second protection layer 270 and a transparent conductive layer 272. As indicated in FIGS. 4A and 4B, the region M1 denotes an active component (such as a thin-film transistor) including a gate line 212, an insulating layer 216, a channel layer 222, an etching stop layer 226, a first data line 232 and a second data line 234. The first data line 232 and the second data line 234 are electrically connected to the channel layer 222 respectively. The first data line 232 may be used as the driving line for the source of the thin-film transistor, the second data line 234 may be used as the signal line for the drain of the thin-film transistor. In addition, the region Cst denotes a storage capacitor, and the second data line 234 and the common electrode line 214 overlap with each other within the region Cst for storing electrical charges. Besides, the region R denotes a light detecting component including a photosensitive resistance layer 260, a contact electrode 252 and a third data line 254. The contact electrode 252 is located on the second data line 234 and makes the second data line 234 and the third data line 254 electrically connected to the photosensitive resistance layer 260 respectively. The light-receiving region on the photosensitive resistance layer 260 may achieve 100% and is not subjected to the patterned area of the pixel, the aperture rate may achieve 100%.

As indicated in FIG. 6A, before the photosensitive resistance layer 260 is radiated by a light, the photosensitive resistance layer 260, having a very large resistance and very low dark state current, is regarded as being shut down. Meanwhile, the gate of the active component M1 remains shutdown, so the electrical charges stored in the storage capacitor Cst remain stable. When the photosensitive resistance layer 260 is radiated by the light, the resistance of the photosensitive resistance layer 260 will decrease as the intensity of the light increases. The third data line 254 is connected to an external bias voltage to form a channel between the second data line 234 and the third data line 254. Meanwhile, the electrical charges, controlled by the electrical field in a horizontal direction, flow towards the third data line 136 and make the voltage of the storage capacitor Cst approaching the bias voltage. Lastly, the gate of the active component M1 is opened, the illumination volume is obtained by using the first data line 232 to read the electrical charges stored in the storage capacitor Cst by each pixel structure 200.

As indicated in FIG. 6B, the detecting module 280 includes a pixel array substrate 282, a driving unit 284 and a detection signal processing unit 286. The pixel array substrate 282 includes a plurality of pixel structures 200 disposed on the substrate 202 as indicated in FIG. 4A. The driving unit 284 connects each gate line 212 for activating or shutting down the active component Ml. The detection signal processing unit 286 connects each first data line 232 to obtain the volume of electrical charges stored by each pixel structure 200 and output a detection signal Sout.

Unlike the electrical field of conventional vertical stacking structure mainly formed by amorphous silicon which is in a vertical direction, the electrical field of the photosensitive resistance layer 260 of the present embodiment is in a horizontal direction. Unlike the conventional vertical stacking structure which requires 11 or more than 11 manufacturing processes, the photosensitive resistance layer 124 of the present embodiment employs fewer processes, so that the difficulties encountered in the manufacturing process are reduced and the procedures are simplified. The manufacturing method of the pixel structure of FIG. 5 is elaborated with the example of the pixel structure 200 of FIG. 4B.

Referring to FIGS. 4B and 5. The process begins at step S510, a deposition process is performed to form a metal layer 210 on a substrate 202, and a first lithography process (lithography and etching processes) is performed to pattern the metal layer 210 to form a gate line 212 and a common electrode line 214. In step S520, an insulating layer 216 is formed on the gate line 212 and the common electrode line 214. The insulating layer 216 may be formed by a silicon oxide layer, a silicon nitride layer or a silicon oxynitride layer. The insulating layer 216 may be used as a gate insulating layer of the active component M1. In step S530, a deposition process is performed to form a semiconductor layer 220 on the insulating layer 216, and a second lithography process is performed to pattern the semiconductor layer 220 to form a channel layer 222. The channel layer 222 is disposed above the gate line 212 and overlaps a part of the gate line 212. In step S540, a third lithography process is performed to form an etching stop layer 226 on the channel layer 222. The etching stop layer 226 avoids defects occurring to the contact surface between the active layer and the source/drain and affecting the ON/OFF switching of the active component M1. The invention does not need to be implemented by the etching stop layer 226 and may be selectively formed on the channel layer 222 according to actual needs.

The channel layer 222 may be formed by an amorphous silicon layer or poly-silicon layer. The channel layer 222 may be formed by IGZO.

In addition, the etching stop layer 226 may be formed by a silicon oxide layer, a silicon nitride layer or a silicon oxynitride layer.

In step S550, a deposition process is performed to form a data line layer 230 on the insulating layer 216, and a fourth lithography process is performed to pattern the data line layer 230 to form a first data line 232 and a second data line 234. As indicated in FIG. 4B, the first data line 232 and the second data line 234 are coupled to the channel layer 222 respectively and combine with the channel layer 222 and the gate line 212 to compose an active component M1.

In step S560, a first protection layer 240 is formed on the first data line 232 and the second data line 234, and a fifth lithography process is performed to form an opening on the first protection layer 240 to expose a part of the second data line 234. In subsequent processes, the contact electrode 252 may be formed on the second data line 234 via the opening. In step S570, a deposition process is performed to form a second metal layer 250, and a sixth lithography process is performed to pattern the second metal layer 250 to form a contact electrode 252 and a third data line 254. The contact electrode 252 is located on the second data line 234, and the third data line 254 is located on the first protection layer 240.

In step S580, a deposition process is performed to form a photosensitive resistance layer 260 on the first protection layer 240, and a seventh lithography process is performed to define a light-receiving region on the photosensitive resistance layer 260 of each pixel structure 200. As indicated in FIG. 4B, the photosensitive resistance layer 260 covers the contact electrode 252 and the third data line 254 and combines with the contact electrode 252, the second data line 234 and the third data line 254 to compose a light detecting component R. The photosensitive resistance layer 260 may be formed by IGZO. In step S590, a second protection layer 270 is formed on the photosensitive resistance layer 260, and an eighth lithography process is performed to make the second protection layer 270 expose each pad at the signal end (not illustrated in the diagram).

In step S600, a deposition process is performed to form a transparent conductive layer 272 on the second protection layer 270, and a ninth lithography process is performed to pattern the transparent conductive layer 272 to form the transparent conductive line, and electrically connect each pad at the signal end.

According to the manufacturing method disclosed in the present embodiment, to avoid the active component M1 being radiated by a light so as to generate a leakage current. In step S570, the patterned second metal layer 250 may further form a mask layer 256 on the first protection layer 240, wherein the mask layer 256 is located above the active component M1 and overlaps the active component M1. The mask layer 256 may be formed by a metal or an opaque reflective material to block the external light.

Third Embodiment

Figure 7A:
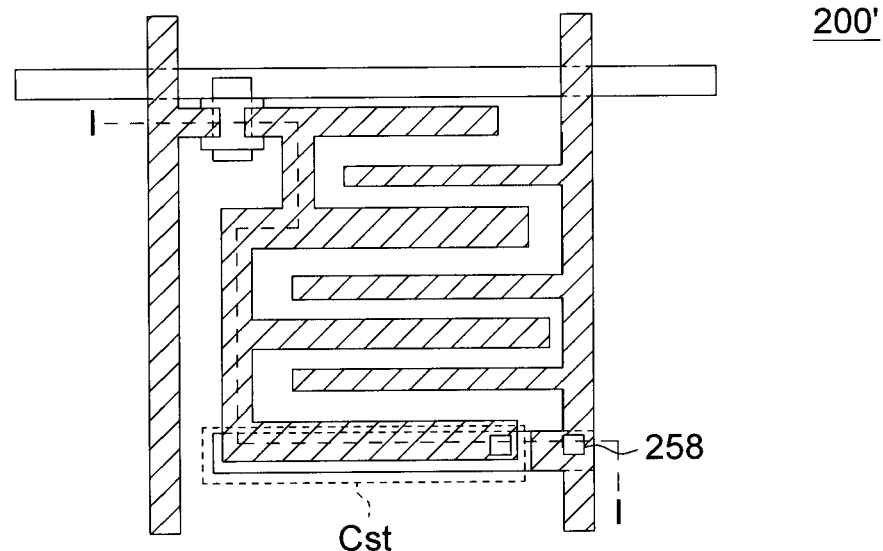
FIGS. 7A and 7B respectively are a top view of a pixel structure and a cross-sectional view of the pixel structure viewed along a cross-sectional line I-I according to a third embodiment of the invention.
Figure 7B:
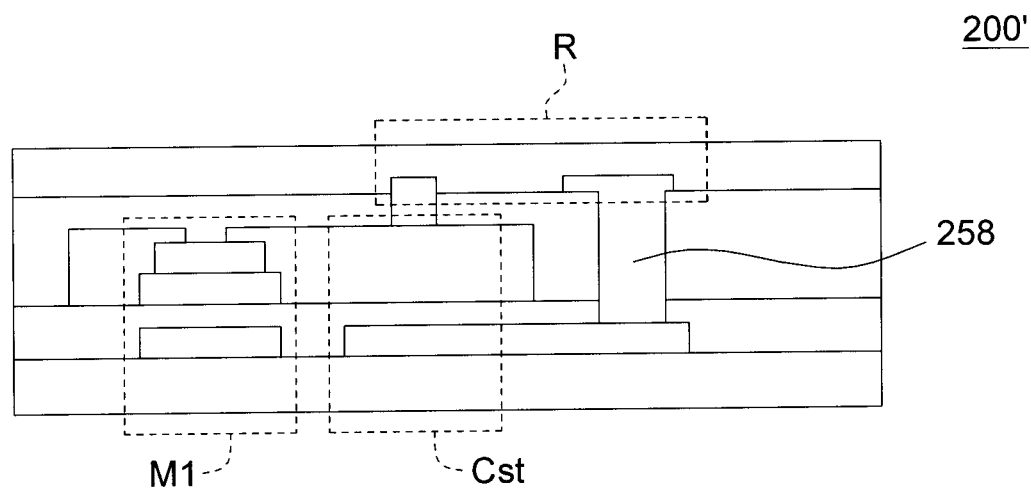
Figure 8:
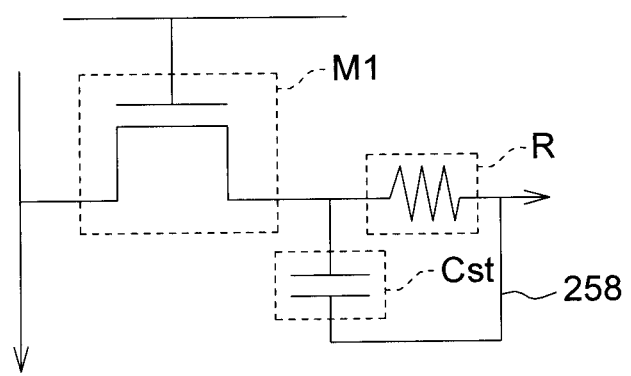
FIG. 8 shows an equivalent circuit diagram of the pixel structure of FIGS. 7A and 7B.

FIGS. 7A and 7B respectively are a top view of a pixel structure and a cross-sectional view of the pixel structure viewed along a cross-sectional line I-I according to a third embodiment of the invention. FIG. 8 shows an equivalent circuit diagram of the pixel structure of FIGS. 7A and 7B. The pixel structure 200' of the present embodiment and the manufacturing method thereof are similar to the pixel structure 200 of the second embodiment, the descriptions of the same elements are not repeated. The pixel structure 200' of present embodiment is different from the pixel structure 200 of the second embodiment in that the patterned second metal layer 250 further includes a conductive plug 258. The conductive plug 258 is a metal penetrating through the first protection layer 240 and the insulating layer 216. During the formation of the second metal layer 250, the conductive plug 258 is firstly formed in a contact window formed by etching the first protection layer 240 and the insulating layer 216, and then the second metal layer 250 is patterned to make the conductive plug 258 electrically connected between the third data line 254 and the common electrode line 214.

According to the pixel structure, the pixel array substrate and the detecting module of the present embodiment of the invention, the photosensitive resistance layer whose electrical field is in a horizontal direction replaces the conventional multi-layer stacking structure of the photodiode whose electrical field is in a vertical direction, so that the difficulties encountered in the manufacturing process are reduced and the procedures are simplified. Therefore, the photosensitive resistance layer whose electrical field is in a horizontal direction in conjunction with the storage capacitor and thin-film transistor may be used as the pixel structure of a light detector to increase the aperture rate or reduce the cost for the light detector.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pixel array substrate, comprising:
   a substrate; and
   a plurality of pixel structures disposed on the substrate, wherein each pixel structure comprises:
   a patterned metal layer, comprising a gate line and a common electrode line;
   an insulating layer covering the gate line and the common electrode line;
   a patterned semiconductor layer located on the insulating layer, wherein the patterned semiconductor layer comprises a channel layer and a photosensitive resistance layer, and the channel layer is located above the gate line and overlaps the gate line; and
   a data line layer located on the insulating layer, wherein the data line layer comprises a patterned first data line, a second data line and a third data line, the first and the second data lines are coupled to the channel layer respectively and combine with the channel layer and the gate line to compose an active component, the second data line and the third data line respectively are coupled to the photosensitive resistance layer and combine with the photosensitive resistance layer to compose a light detecting component.

2. The pixel array substrate according to claim 1, wherein the photosensitive resistance layer is shut down before the photosensitive resistance layer is radiated by a light, and the photosensitive resistance layer forms a channel between the second data line and the third data line when the photosensitive resistance layer is radiated by the light.

3. The pixel array substrate according to claim 1, wherein the photosensitive resistance layer is formed by indium gallium zinc oxide (IGZO).

4. The pixel array substrate according to claim 1, further comprising a protection layer and a mask layer, wherein the protection layer covers the first data line, the second data line and the third data line, and the mask layer, disposed on the protection layer, is located above the active component and overlaps the active component.

5. A pixel array substrate, comprising:
a substrate; and
a plurality of pixel structures disposed on the substrate, wherein each pixel structure comprises:
  a patterned first metal layer, comprising a gate line and a common electrode line;
  an insulating layer covering the gate line and the common electrode line;
  a channel layer located on the insulating layer, wherein the channel layer is located above the gate line and overlaps the gate line;
  a data line layer located on the insulating layer, wherein the data line layer comprises a patterned first data line and a second data line, and the first and the second data lines are coupled to the channel layer respectively and combines with the channel layer and the gate line to compose an active component;
  a first protection layer covering the first data line and a part of the second data line;
  a patterned second metal layer, comprising a contact electrode and a third data line, wherein the contact electrode is located on the second data line, and the third data line is located on the first protection layer; and
  a photosensitive resistance layer disposed on the first protection layer, wherein the photosensitive resistance layer covers the contact electrode and the third data line and combines with the contact electrode, the second data line and the third data line to compose a light detecting component.

6. The pixel array substrate according to claim 5, wherein the photosensitive resistance layer is shut down before the photosensitive resistance layer is radiated by a light, and the photosensitive resistance layer forms a channel between the second data line and the third data line when the photosensitive resistance layer is radiated by the light.

7. The pixel array substrate according to claim 5, wherein the photosensitive resistance layer is formed by IGZO.

8. The pixel array substrate according to claim 5, further comprising a second protection layer covering the photosensitive resistance layer, wherein the patterned second metal layer further comprises a mask layer disposed on the first protection layer and located above the gate line and overlaps the active component.

9. The pixel array substrate according to claim 5, wherein the patterned second metal layer further comprises a conductive plug connected between the third data line and the common electrode line.

10. A detecting module, comprising:
a pixel array substrate, comprising:
  a substrate; and
  a plurality of pixel structures disposed on the substrate, wherein each pixel structure comprises:
    a patterned metal layer, comprising a gate line and a common electrode line;
    an insulating layer covering the gate line and the common electrode line;
    a patterned semiconductor layer located on the insulating layer, wherein the patterned semiconductor layer comprises a channel layer and a photosensitive resistance layer, and the channel layer is located above the gate line and overlaps the gate line; and
    a data line layer located on the insulating layer, wherein the data line layer comprises a patterned first data line, a second data line and a third data line, the first and the second data lines are coupled to the channel layer respectively and combine with the channel layer and the gate line to compose an active component, and the second data line and the third data line are coupled to the photosensitive resistance layer respectively and combine with the photosensitive resistance layer to compose a light detecting component;
a driving unit connecting each gate line; and
a detection signal processing unit connecting each first data line.

11. The detecting module according to claim 10, wherein the photosensitive resistance layer is shut down before the photosensitive resistance layer is radiated by a light, and the photosensitive resistance layer forms a channel between the second data line and the third data line when the photosensitive resistance layer is radiated by the light.

12. The detecting module according to claim 10, wherein the photosensitive resistance layer is formed by IGZO.

13. The detecting module according to claim 10, further comprising a protection layer and a mask layer, wherein the protection layer covers the first data line, the second data line and the third data line, and the mask layer disposed on the protection layer is located above the gate line and overlaps the active component.

* * * * *